United States Patent
Krause

(10) Patent No.: US 9,983,783 B2
(45) Date of Patent: May 29, 2018

(54) METHOD FOR OPERATOR GUIDANCE, CONTROL PANEL COMPONENT, PRODUCTION OF A CONTROL PANEL COMPONENT AND HOME APPLIANCE COMPRISING A CONTROL PANEL COMPONENT

(71) Applicant: PAS Deutschland GmbH, Neuruppin (DE)

(72) Inventor: Olaf Krause, Neuruppin (DE)

(73) Assignee: PAS Deutschland GmbH, Neuruppin (DE)

( * ) Notice: Subject to any disclaimer, the term of this patent is extended or adjusted under 35 U.S.C. 154(b) by 0 days. days.

(21) Appl. No.: 14/193,094

(22) Filed: Feb. 28, 2014

(65) Prior Publication Data

US 2015/0160850 A1 Jun. 11, 2015

(30) Foreign Application Priority Data

Dec. 10, 2013 (DE) .................. 10 2013 113 772

(51) Int. Cl.
*G06F 3/0488* (2013.01)
*A47L 15/42* (2006.01)
(Continued)

(52) U.S. Cl.
CPC .......... *G06F 3/04883* (2013.01); *A47L 15/42* (2013.01); *D06F 39/005* (2013.01);
(Continued)

(58) Field of Classification Search
CPC .. G06F 3/0488; G06F 3/03547; G06F 3/0481; G06F 3/038; G06F 3/041;
(Continued)

(56) References Cited

U.S. PATENT DOCUMENTS 3,819,906 A * 6/1974 Gould, Jr. ............... F24C 7/087
219/498
5,943,044 A * 8/1999 Martinelli et al. ............ 345/174
(Continued)

FOREIGN PATENT DOCUMENTS

CN         102418947 A     4/2012
DE    102005018298     10/2006
(Continued)

OTHER PUBLICATIONS

European Search Report for corresponding European Patent Application No. 14196990.7, dated May 4, 2015.
(Continued)

*Primary Examiner* — Lun-Yi Lao
*Assistant Examiner* — Johny Lau
(74) *Attorney, Agent, or Firm* — Jason H. Vick; Sheridan Ross PC

(57) ABSTRACT

There is presented a method for selective operator guidance for operator inputs, in particular for operator inputs in a home appliance, to a control panel component, in particular for an operating control panel for a home appliance, and to a method for producing a control panel component, in particular for an operating control panel of a home appliance. In one aspect, the control panel component includes a cover layer, a sensor layer which covers a rear side of the cover layer in a flat manner, at least sectionally, and an indicator layer comprising at least one discrete indicator element, wherein the sensor layer is arranged between the cover layer and the at least one discrete indicator element, wherein the sensor layer is configured to detect operator inputs, in particular operator gestures, wherein the sensor layer is arranged to be activated sectionally depending on a desired input mode, and wherein the at least one discrete
(Continued)

indicator element is arranged to be actuated for selective operator guidance.

20 Claims, 7 Drawing Sheets

(51) Int. Cl.
  *H03K 17/96* (2006.01)
  *G06F 3/01* (2006.01)
  *G06F 3/044* (2006.01)
  *F24C 7/08* (2006.01)
  *D06F 39/00* (2006.01)

(52) U.S. Cl.
  CPC .............. *F24C 7/086* (2013.01); *G06F 3/016* (2013.01); *G06F 3/044* (2013.01); *H03K 17/96* (2013.01); *H03K 17/9622* (2013.01); *G06F 2203/04103* (2013.01); *G06F 2203/04808* (2013.01); *H03K 2217/96066* (2013.01); *H03K 2217/960755* (2013.01); *Y10T 29/49002* (2015.01)

(58) Field of Classification Search
  CPC . G06F 2203/04103; G06F 2203/04808; G06F 3/016; G06F 3/044; G06F 3/04883; G06F 3/01; G06F 3/04103; G06F 3/04808; H04N 2005/443; H04N 21/4316; A47L 15/42; F24C 7/08; F24C 7/086; H03K 17/96; H03K 17/9622; H03K 2217/96066; H03K 2217/960755; Y10T 29/49002; G09G 5/00; H05B 3/02; G02F 1/1335; D06F 39/005

See application file for complete search history.

(56) References Cited

U.S. PATENT DOCUMENTS

| | | | | |
|---|---|---|---|---|
| 6,355,914 | B1* | 3/2002 | Stockley | ................. 219/482 |
| 6,765,557 | B1* | 7/2004 | Segal | ............. G06F 3/0488 |
| | | | | 345/173 |
| 7,154,483 | B2* | 12/2006 | Kobayashi | .................... 345/173 |
| 2001/0020578 | A1 | 9/2001 | Baier | |
| 2008/0017046 | A1* | 1/2008 | Huber | ............. F24C 7/082 |
| | | | | 99/325 |
| 2009/0090605 | A1* | 4/2009 | Arione | ............ H03K 17/962 |
| | | | | 200/314 |
| 2009/0261088 | A1* | 10/2009 | Isoda | ............... F24C 7/082 |
| | | | | 219/489 |
| 2010/0145483 | A1* | 6/2010 | McGonagle et al. | ............ 700/83 |
| 2011/0012845 | A1* | 1/2011 | Rothkopf | ............. G06F 3/044 |
| | | | | 345/173 |
| 2012/0118714 | A1* | 5/2012 | Shigeoka et al. | ............. 200/181 |
| 2012/0200789 | A1* | 8/2012 | Molne | ................ G06F 3/0414 |
| | | | | 349/12 |
| 2012/0314348 | A1* | 12/2012 | Moncrieff | ........... H05K 5/0017 |
| | | | | 361/679.01 |

FOREIGN PATENT DOCUMENTS

| | | |
|---|---|---|
| DE | 102005032088 | 1/2007 |
| DE | 102008032451 | 2/2010 |
| EP | 1133057 | 9/2001 |
| EP | 1273851 | 1/2003 |
| WO | WO 2007/006624 | 1/2007 |

OTHER PUBLICATIONS

Office Action (Including Translation) for corresponding Chinese Application No. 201410097511.X, dated Jan. 19, 2018.

* cited by examiner

METHOD FOR OPERATOR GUIDANCE, CONTROL PANEL COMPONENT, PRODUCTION OF A CONTROL PANEL COMPONENT AND HOME APPLIANCE COMPRISING A CONTROL PANEL COMPONENT

CROSS-REFERENCES TO RELATED APPLICATIONS

This application claims priority from German patent application 10 2013 113 772.5, filed on Dec. 10, 2013. The entire content of that priority application is fully incorporated by reference herewith.

BACKGROUND

The disclosure relates to a method for selective operator guidance for operator inputs, in particular for operator inputs in a home appliance. In addition, the disclosure relates to a control panel component, in particular for an operating control panel of a home appliance, and to a method for producing a control panel component, in particular for an operating control panel of a home appliance.

The approaches and configurations described and explained below may be used in particular in the field of home appliances. Home appliances may include in particular so-called "white goods", i.e., for example, conventional appliances for cooling, washing, cooking, baking etc.

Control panel arrangements or operating front plates in home appliances may generally comprise interfaces for user interaction. These may involve, for example, displays, warning lights, rotary switches, pushbuttons, momentary-contact pushbuttons, touch-sensitive surfaces or displays and associated labels or symbols. Conventional input elements such as, for example, buttons or switches often result in a certain degree of complexity in terms of the manufacture of operating front plates and control panel arrangements. This complexity may be even greater the more possibilities there are for user interaction, i.e. the more user inputs are possible. In addition, a significant increase in the number of switches, buttons or the like can make operating the home appliance more difficult.

Various approaches are known from the prior art for enabling a plurality of operator inputs using only one "user interface". In this connection, DE 10 2008 032 451 A1 discloses a cooking appliance and a method for operating a cooking appliance, wherein the cooking appliance comprises an input display which is arranged as a touchscreen and may graphically display various information. In particular, this includes representing information in the form of graphical visualizations and/or animations. However, such a configuration is associated with a high level of complexity and is therefore essentially only suited for high-end appliances and for appliances for professional use.

In view of this it is an object to present a method for selective operator guidance in a home appliance.

It is a further object to present a control panel component, in particular an operating control panel for a home appliance, which is suitable for implementing the above operator guidance method.

It is a further object to present a corresponding method for producing such a control panel component, which may be implemented with little complexity and nevertheless may allow an extended user interaction.

It is a further object to present a control panel component that is suitable for a large number of variants and configurations in order to be able to limit the manufacturing complexity involved even in the case of relatively small production batch sizes.

It is a further object to allow for operator guidance which facilitates operation and use of the home appliance.

It is a further object to present a front plate arrangement and a home appliance comprising such a front plate arrangement that provides a high-quality integrated configuration.

It is yet a further object to present a front plate arrangement and a home appliance comprising such a front plate arrangement that may be perceived by the operator as providing high visual quality.

SUMMARY

In respect of the operating method, these and other objects of the present disclosure are achieved by a method for selective operator guidance for operator inputs, in particular for operator inputs in a home appliance, comprising the following steps:
providing a control panel component comprising a sensor layer hidden by a cover layer, in particular a sensor layer extending in a flat manner, which is designed to detect operator inputs, in particular operator gestures,
defining a present input mode, comprising:
allocating at least one defined field to be evaluated for operator inputs, in particular operator gestures, on the sensor layer depending on the desired input mode, and
detecting and evaluating operator inputs in the field to be evaluated.

In respect of the control panel component, these and other objects of the present disclosure are achieved by a control panel component, in particular for an operating control panel for a home appliance, comprising the following: a cover layer, a sensor layer, which covers a rear side of the cover layer in a flat manner, at least sectionally, an indicator layer comprising at least one discrete indicator element, wherein the sensor layer is arranged in between the cover layer and the at least one discrete indicator element, wherein the sensor layer is designed to detect operator inputs, in particular operator gestures, wherein the sensor layer may be activated sectionally depending on a desired input mode, and wherein the at least one discrete indicator element is actuable for selective operator guidance.

In respect of the production method, these and other objects of the present disclosure are achieved by a method for producing a control panel component, in particular an operating control panel for a home appliance, comprising the following steps:
providing a cover layer, in particular a cover layer consisting of a plastic material,
providing a sectionally activatable sensor layer, in particular a sensor layer extending in a flat manner, which is selected to detect operator inputs, in particular operator gestures,
joining the cover layer and the sensor layer, and
allocating at least one field to be evaluated for operator inputs on the sensor layer depending on a desired configuration of the control panel component.

According to the present disclosure, the sensor layer may be arranged "invisibly" to a user behind the cover layer, wherein the sensor layer defines a region, in particular an area, in which operator inputs may potentially be detected. During production or during operation, a section of the sensor layer may now be selected and activated in a targeted manner in order to be able to detect and evaluate user inputs there. In other words, the control panel component may comprise a basic configuration and be actuated in variant-specific fashion depending on the desired configuration. It is thus conceivable, for example, to use at least one or more (areal) sections of the sensor layer in the selected variant actually for the detection and evaluation of the operator inputs. In this way, a large number of variants in terms of the control panel component may be implemented with little complexity.

In addition, the actuation or allocation of the sensor layer or the selected sections of the sensor layer during operation may take place depending on the presently desired input mode. In other words, this means that one and the same sensor layer or sections thereof may be selected for different inputs. In other words, for example, in the case of a washing machine, a specific selected section of the sensor layer may be used both for selecting a wash program (first input mode) and for selecting a wash temperature (second input mode). This example is cited merely by way of representation of a large number of conceivable combinations and configurations, for illustrative purposes.

The sensor layer is arranged on that side of the cover layer of the control panel component which is remote from the operator in the installed state. Accordingly, this does not result in any optical impairments when only one subsection of the sensor layer is actually used for detection and evaluation of operator inputs.

In accordance with various aspects of the present disclosure, the control panel component may be provided with an indicator layer (or: indicator plane), which is arranged behind the sensor layer (when viewed from the cover layer). In other words, the indicator layer and the sensor layer are arranged one on top of the other, at least sectionally. The indicator layer may be formed from at least one discrete indicator element. Within the meaning of the present disclosure, the discrete indicator element may be, in particular, an optical indicator element which is designed to represent a limited quantity of information. A discrete indicator element is in particular not a graphical indicator which is designed to represent images generated from pixels. A discrete indicator element within the meaning of the present disclosure may be, for example, status symbols, warning indicators, warning LEDs, bar indicators, segment indicators and similar "discrete" indicator elements. Discrete indicator elements are generally much more favorable than pixel-based graphical indicator elements. In addition, discrete indicator elements generally comprise an increased level of robustness and suitability for fluctuating environmental conditions. In other words, a large quantity of information may also be represented without a pixel-based display. The operator may be given the impression that he is interacting directly with the indicator since he may perform inputs directly in the region of the activated or activatable discrete indicator elements.

In accordance with various aspects of the present disclosure, at least one discrete indicator element or a plurality of discrete indicator elements which define the indicator layer, may be arranged "behind" the sensor layer. The at least one discrete indicator element may be used in connection with the facility for the allocation and activation of sections of the sensor layer for selective operator guidance or operator instruction. By way of example, at least one discrete indicator element may be activated selectively in order to output an optical signal, which indicates to the operator that he may perform inputs in the region of the activated indicator element, which inputs are detected by the (hidden) sensor layer.

In an exemplary embodiment, the control panel component, in particular its sensor layer, is designed to detect analog or quasi-analog inputs by the user. In other words, in an exemplary embodiment the sensor layer is used not only to switch specific functions on or off (digitally). Instead, it is now possible to detect extended user inputs, in particular user gestures, which enable the selection of a value within a value range, for example. In this way, the operation of the home appliance may be significantly simplified. For example, the operator may select a target temperature within a comparatively wide temperature range simply by "swiping" along the cover layer. However, the operator may also, in a different operating mode, perform a program selection, for example, in the same region when this is indicated to him by a corresponding activated discrete indicator element.

Operator inputs may generally include an increase in proximity to the cover layer and/or touching of the cover layer. Operator inputs may also be performed in punctiform fashion (for example in the form of a click or a double click). However, operator inputs may also include movement paths, such as swiping movements, circular movements or the like. Operator inputs may in principle be performed using an aid, for example a stylus, or by means of body parts, in particular fingers or thumbs. Operator inputs may also be combined in order to enable complex functions. These may be, for example, a zoom function, i.e., for example, an enlargement or reduction function. The sensitivity of the sensor layer to specific user inputs may be influenced, for example, by means of such complex gestures. Other extended/complex inputs are conceivable. For example, the sensitivity to swipe gestures, for example for temperature selection or time selection, may be influenced by means of a zoom gesture.

Within the meaning of the present disclosure, the term operator guidance may include an instruction or direction for performing an input to the operator, but in addition also feedback to the operator once an input has been made. An instruction may be provided, for example, when an activated discrete indicator element indicates or highlights a specific region of the (hidden) sensor layer which is at present activated for detection of operator gestures. Feedback to the operator may include, for example, a specific optical output used as a response to a specific operator input. This may include, for example, a change to a bar indicator which is in the form of a discrete indicator element. In addition, the optical output may include, for example, a change in color of a discrete indicator element. In this way, indicator elements with a relatively simple configuration per se may be used to represent complex information. A sufficiently detailed user interaction may take place; this may increase the value, as perceived by the operator.

In an exemplary embodiment, the cover layer of the control panel component completely covers the sensor layer. The cover layer is in particular a substantially closed cover layer which completely covers the sensor layer. In an exemplary embodiment, the sensor layer is arranged on the rear side of the cover layer, i.e. on that side of the cover layer which is remote from the operator during normal operation.

The manufacturing method for producing the control panel component enables a high degree of flexibility during production. Since, by means of the sectionally activatable sensor layer, a large potentially activatable sensor area may be provided, sections for user inputs of this sensor area may be selected in a targeted manner by suitable contact being made or suitable actuation (in each case in accordance with the presently desired configuration). The introduction of the sectionally activatable sensor layer is not associated with significant additional complexity. Instead, cost advantages in terms of production may result since a large number of variants may be realized on the basis of one basic configuration. The variants may differ from one another in terms of the variety of functions, for example. Irrespective of whether the home appliance to be produced has a small function range, an average function range or even a large function range, the required operator inputs may be detected and evaluated in a simple manner by the configuration and actuation of the activatable sensor layer.

By way of example, the control panel component may be provided with the sensor layer in the mentioned manner and may be printed on its side facing the operator or treated in another way in order to produce operating symbols which may be perceived by the operator. On the basis of the presently selected layout for the printing or processing, a layout corresponding to this of the sensor layer for selective activation may now be selected using software or control engineering. In other words, for example, a control device may be configured and designed, for example, in such a way that operator inputs are detected only in those regions of the sensor layer which correspond to the operator symbols produced on the cover layer. The corresponding assignment of the selected sections of the sensor layer may be realized in a simple manner on a software basis or using circuitry. In other words, a freely scalable control panel may be produced. The control panel may be provided with its function allocation at the end of the production process.

In an exemplary embodiment, the method for producing the control panel component may include the following steps:

providing at least one discrete indicator element, joining the cover layer, the sensor layer and the at least one discrete indicator element, wherein the sensor layer is arranged in between the cover layer and the at least one discrete indicator element, and providing an interface for a control device for actuating the at least one discrete indicator element and for evaluating operator inputs detected at the sensor layer for selective operator guidance.

The interface may be, for example, a contact with the sensor layer, via which the control device communicates with the sensor layer. In addition, the interface may include contact between the control device and the at least one discrete indicator element, with the result that the control device may activate or deactivate selectively the at least one discrete indicator element.

In addition, the method may comprise the following step:

allocating at least one defined field to be evaluated for operator inputs, in particular operator gestures, on the sensor layer for defining a present input mode depending on the desired input mode.

In an exemplary embodiment, alternatively or in addition, the method may include the following steps:

processing the cover layer, in particular printing or coating, for producing at least one optically and/or haptically perceivable operating symbol for operator guidance, and allocating at least one field to be evaluated for operator inputs on the sensor layer depending on a size and/or arrangement of the at least one optically and/or haptically perceivable operating symbol for selective operator guidance.

In other words, the operator guidance may be performed by means of selectively activatable elements, the at least one discrete indicator element, and by permanently provided elements, the at least one optically and/or haptically perceivable operating symbol. Both types of elements may be combined with one another.

In an exemplary embodiment of the control panel component, the sensor layer is designed as a capacitive sensor layer, wherein the sensor layer is in particular designed to detect touches on the cover layer and/or increasing proximity to the cover layer in the region of the sensor layer.

In other words, the sensor layer may be configured as a projected-capacitive sensor layer, for example. The sensor layer may in particular be configured as a film-based sensor layer. It goes without saying that other functional principles for the sensor layer for detecting touches and/or increasing proximity to the cover layer may be used. By way of example, the sensor layer may be configured as an inductive sensor layer, a resistive sensor layer, an optical sensor layer and/or a combined sensor layer.

The sensor layer may comprise in particular two planes which are insulated from one another and which are each provided with a conductive material. By way of example, a first plane may comprise a row structure and a second plane may comprise a column structure. Other configurations such as, for example, rhombuses or the like are conceivable. In an exemplary embodiment, the sensor layer is configured such that multidimensional operator gestures and/or a plurality of operator inputs may be detected simultaneously. Multidimensional operator gestures may include, for example, swiping movements. The capacity to simultaneously detect a plurality of operator inputs may be characterized as, for example, multi-touch capability.

In an exemplary embodiment, the control panel component comprises an interface for a control device, which is designed to actuate selectively the sensor layer and the at least one discrete indicator element in order to define a plurality of input modes. The at least one discrete indicator element may be activated selectively in order to indicate to an operator that a specific type of input may be performed at a specific location on the sensor layer. The control device may activate and correspondingly evaluate a section of the sensor layer for inputs in a targeted manner via the interface.

In an exemplary embodiment of the control panel component, the control device is designed to define a present input mode, wherein the control device is designed further to allocate at least one field to be evaluated for operator inputs on the sensor layer taking into consideration at least one selected input mode. This may be associated with the activation of at least one discrete indicator element in order to indicate to the operator where he may perform his inputs and what type of input is required at present.

In other words, in some exemplary embodiments a system for detecting operator inputs may be formed which comprises at least one control panel component and at least one control device in accordance with one of the abovementioned aspects. Such a system may be formed firstly as a discrete component. Secondly, it is conceivable for the control function for actuating the control panel component to be transferred to a (superordinate) control device of the home appliance. Accordingly, the system may be formed, during fitting, by joining the control panel component to complete the home appliance.

In accordance with a further configuration of the control panel component, the indicator layer comprises at least one indicator element which is in the form of a discrete, selectively activatable symbol or a discrete, selectively activatable segment indicator, in particular in the form of a seven-segment indicator. A selectively activatable symbol may be, for example, a light-emitting diode or a collection of light-emitting diodes. The selectively activatable symbol may further comprise a symbol representation, for example a silhouette which may be illuminated by means of an LED or a similar light source or a pictogram. A selectively activatable segment indicator may comprise, for example, a bar indicator, a circular segment indicator, a multi-segment indicator for representing alphanumeric information or the like. In some exemplary embodiments, various indicator types may be combined with one another in order to form the at least one indicator element. The at least one indicator element may be matched in particular to an expected user input. Thus, for example, a swipe function may be combined with a bar segment indicator and/or an alphanumeric segment indicator. By swiping along the presently activated section of the sensor layer, the operator may influence the directly indicated value, with the result that direct feedback to the operator is provided. The at least one indicator element may also visualize a limitation of the presently defined field.

In an exemplary embodiment, the cover layer and the sensor layer are configured so as to be transparent or translucent, at least sectionally. In other words, the cover layer and the sensor layer may be at least sectionally optically transmissive and therefore the optical perception of the at least one discrete indicator element which may be covered both by the sensor layer and by the cover layer may be improved. The cover layer and the sensor layer may be configured to be at least partially transparent or translucent, with the result that, for example when a discrete indicator element is not activated, this is not perceivable to the operator. In this way, the operation of the home appliance may be simplified further since discrete indicator elements which are not presently required may be made "invisible".

In accordance with a further configuration of the control panel component, the cover layer is surface-treated, in particular printed or coated, at least sectionally, and wherein the cover layer comprises at least one optically and/or haptically perceivable operating symbol for operator guidance. By way of example, the cover layer may be printed. Alternatively or in addition, the cover layer may be provided with raised or depressed structural elements. In addition, it is conceivable for the surface structure of the cover layer to be influenced in a targeted manner in order to clearly highlight the at least one operating symbol. The mentioned measures may be combined with one another.

In this way, the control panel component may be provided with permanently visible elements, as an alternative or in addition to the selectively activatable discrete indicator elements, in order to identify input possibilities for the operator. The at least one optically and/or haptically perceivable operating symbol may comprise, for example, a graphical representation and/or an alphanumeric representation. In particular, the use of pictograms is conceivable. In the case of the sensor layer, a corresponding field or a section in which user inputs which are linked to the operator symbol may be detected may be assigned to the at least one operating symbol of the cover layer.

In an exemplary embodiment, a control panel component in accordance with one of the abovementioned aspects is used in a home appliance.

In an exemplary embodiment, the method for selective operator guidance may include the following step:
   activating at least one discrete indicator element of an indicator layer which is arranged on that side of the sensor layer which is remote from the cover layer for identifying the field to be evaluated of the sensor layer In an exemplary embodiment, the defined field to be evaluated is at least adjacent to the activated discrete indicator element. In a further exemplary embodiment, the allocated field to be evaluated is in front of the activated discrete indicator element (for the operator). In this way, the operator may be given the impression of being able to perform desired inputs, for example a selection of or a change to a value, directly with the indicator element.

In accordance with a further exemplary embodiment of the method for operator guidance, the step of defining the present input mode further comprises the step of assigning the field to be evaluated for operator inputs to an operating symbol, which may be perceived optically and/or haptically on the cover layer. In this way, permanently perceivable symbols may also be used for instruction and guidance of the operator. In an exemplary embodiment, permanently visible elements and selectively activatable elements may be combined with one another in order to further increase operator convenience and to be able to reduce the risk of erroneous operations. In a further exemplary embodiment, the method for selective operator guidance further includes the step of outputting feedback to the operator, in particular visual feedback, by selective activation of at least one discrete indicator element of the indicator layer. The activation of the at least one discrete indicator element may also include, for example, a change to the at least one discrete indicator element. This may include, by way of example, a change in color. In addition, this may also include a change to a discrete bar indicator or segment indicator.

In an exemplary embodiment, the discrete indicator element activated for the purpose of feedback to the operator is, when viewed by the operator, in the presently allocated field or at least in the vicinity of the presently allocated field, with the result that the impression of direct feedback is provided. This may further increase the perceived value of the home appliance and operating procedure.

It is to be understood that the previously mentioned features and the features mentioned in the following may not only be used in a certain combination, but also in other combinations or as isolated features without leaving the spirit and scope of the present disclosure.

BRIEF DESCRIPTION OF THE DRAWINGS

Further features and exemplary embodiments are disclosed in the description below with reference to the drawings, in which.

DETAILED DESCRIPTION OF EXEMPLARY EMBODIMENTS

Figure 1:
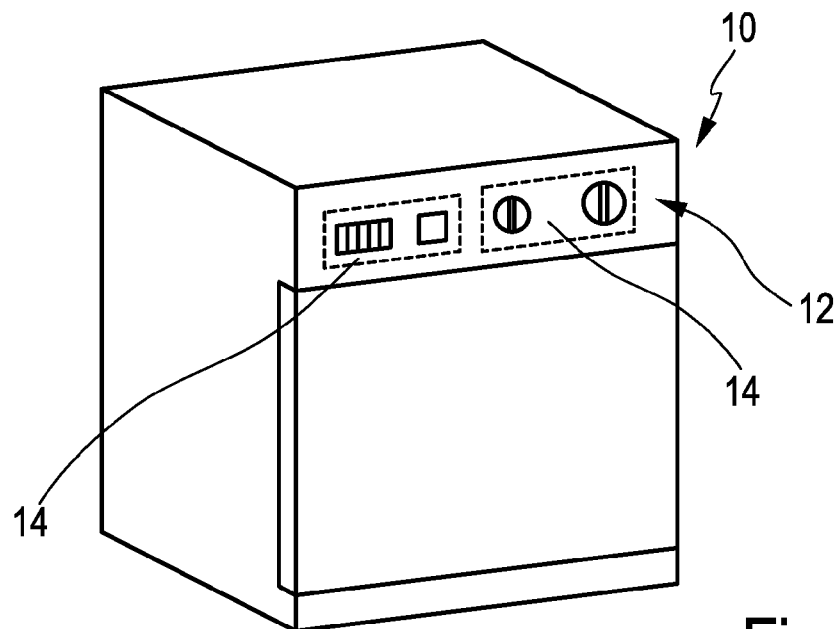
FIG. 1 shows a perspective view of a home appliance comprising an operating front plate.

FIG. 1 shows a perspective view of a home appliance 10, which comprises a front plate arrangement or operating control panel 12. The home appliance 10 may be, for example, a dishwasher or the like. Home appliances 10 may be configured, by way of example, as washing machines, refrigerators, freezers, ovens, hobs, microwaves, tumble dryers or the like. Home appliances which combine various functions, such as refrigerator/freezer combinations, for example, are also conceivable.

By way of example, the operating front plate 12 comprises at least one control panel component 14. The at least one control panel component 14 may comprise regions in which elements for operation or for user interaction are arranged. It goes without saying that the operating front plate 12 may in particular be substantially integral. The control panel component(s) 14 may be integral parts of the operating front plate 12. However, it is also conceivable for a plurality of control panel components 14 to be embodied as individual parts and to be joined to form the operating front plate 12.

Figure 2:
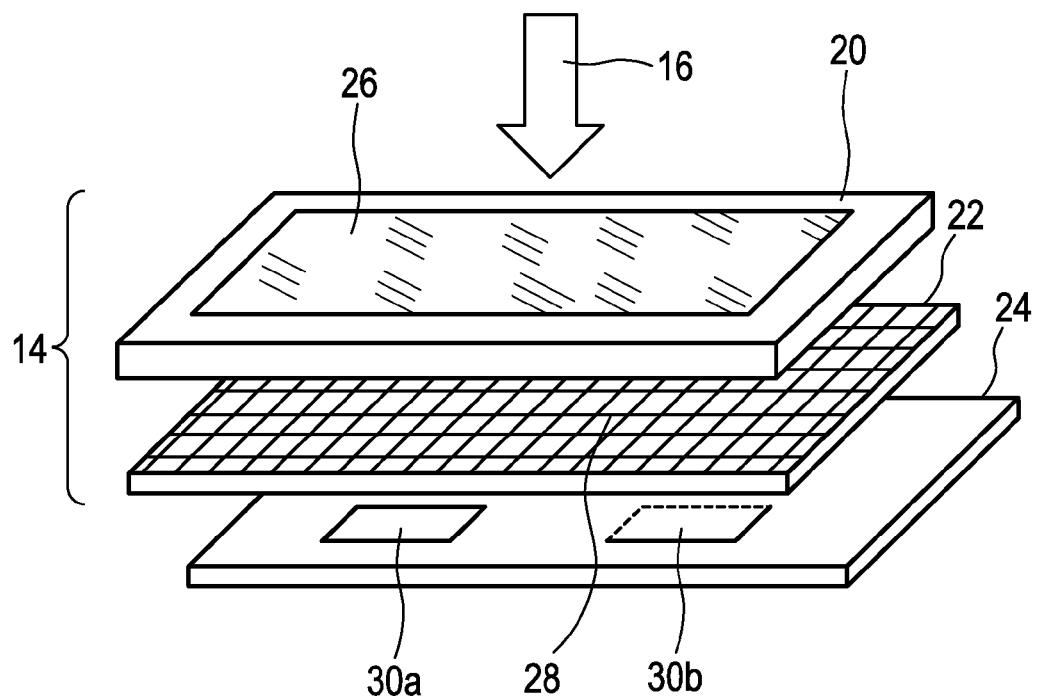
FIG. 2 shows a simplified, perspective exploded illustration of a front plate component for an operating front plate of a home appliance.

FIG. 2 shows a very simplified schematic perspective exploded illustration of an exemplary configuration of a control panel component 14. An arrow denoted by 16 in this case identifies a typical viewing direction of an operator who may perform operating inputs at the control panel component 14. On its side facing the operator, the control panel component 14 comprises a cover layer 20, which may in particular be configured as a plastic component. A sensor layer 22 is arranged "behind" or "underneath" the cover layer 20, from the point of view of the operator. The sensor layer 22 may be in the form of, for example, a sensor layer 22 for detecting touches or increasing proximity. It goes without saying that the sensor layer 22 in the exemplary embodiment illustrated using FIG. 2 may be designed to detect touches or increasing proximity on the plane of the cover layer 20, which may cover, in particular completely cover, the sensor layer 22. The sensor layer 22 may in particular be configured as an at least sectionally touch-sensitive conductive film.

A so-called indicator layer 24 may adjoin the sensor layer 22 at the rear, i.e. on that side of the control panel component 14 which is remote from the operator during normal operation. This indicator layer may be configured, for example, to visually highlight specific regions of the sensor layer 22 for the operator for the purposes of operator guidance and interaction. In accordance with various exemplary configurations, the cover layer 20 may be provided at least partially with transparent or translucent regions 26. Similarly to this, the sensor layer 22 may also be configured so as to be translucent or transparent, at least sectionally.

This sensor layer 22 may comprise a sensor network 28 and be configured as a film component, for example, which comprises various conductive regions. The sensor layer 22 may be configured as a transparent film, but alternatively also as a substantially opaque film. It goes without saying that the sensor layer 22 may comprise a layer structure, for example various conductive layers which are insulated from one another. The sensor layer 22 may generally define a region in which operator inputs (touches or increasing proximity) in the region of the cover layer 20 may be detected and evaluated.

The indicator layer (also: indicator plane) 24 may comprise at least one discrete indicator element 30. By way of example, the indicator layer 24 illustrated using FIG. 2 comprises a first discrete indicator element 30a and a second discrete indicator element 30b. The indicator layer 24 does not need to be provided as a physical part. Instead, the indicator layer 24 may be interpreted, at least in some configurations, as a (logical) combination of various discrete indicator elements 30. It goes without saying, however, that, in alternative configurations, the indicator layer 24 may act as a carrier structure for the at least one discrete indicator element 30, by way of example.

The at least one discrete indicator element 30 may be configured, by way of example, as a pictogram, a symbol, (predefined) alphanumeric indicator, a segment indicator, a segmented bar indicator or the like. The at least one discrete indicator element 30 should in particular not be understood as being limited to a pixel-based graphical indicator element. Instead, in some exemplary embodiments the at least one discrete indicator element is predefined and designed in such a way that precisely one item of graphical information or a specific number of different items of graphical information are represented. The at least one discrete indicator element may be illuminated in particular in order to ensure sufficient visual highlighting for the operator. Light-emitting diodes, (discrete) LCD elements or the like are suitable for this, for example. A limited variation of the information which may be represented by the at least one discrete indicator element 30 may be performed, for example, by color highlighting. In addition, in particular in the case of segment-like discrete indicator elements 30, a variation of the information which may be represented may be performed by actuation of various segments/sub-elements. Accordingly, alphanumeric information items, in any case to a limited extent, may also be represented by means of segment indicators, wherein the number of digits or letters which may be indicated is predefined and limited.

Control panel components 14 in accordance with various configurations of the present disclosure make use of the fact that the sensor layer 22 may be applied to the cover layer 20 over a large area at reasonable cost. Joining the cover layer 20 to the sensor layer 22 may comprise, for example, adhesive bonding, encapsulation by injection molding, in-mold molding, embedding, force-fitting and/or form-fitting mounting and further conventional joining methods. In this way, the control panel component 14 may be manufactured with a basic configuration, for example comprising the cover layer 20 and the sensor layer 22, with a reasonable level of complexity with mass production. The control panel component 14 is particularly suited for selective prefabrication. For example, this may include the allocation of sections of fields of the sensor layer 22 for detection of specific operator inputs. In other words, a predefined basic configuration by means of targeted actuation of the sensor layer may be used with little complexity for a large number of variations in respect of the ranges of operations allowed and offered.

Figure 3:
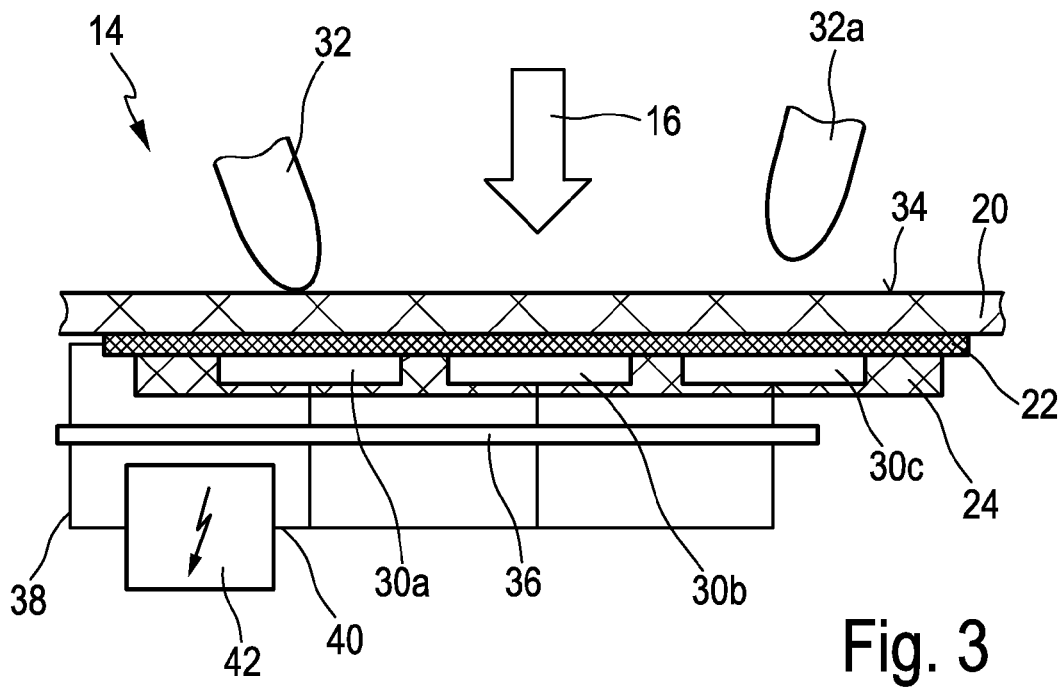
FIG. 3 shows a very simplified schematic illustration of a lateral section through a configuration of a front plate component.
Figure 4:
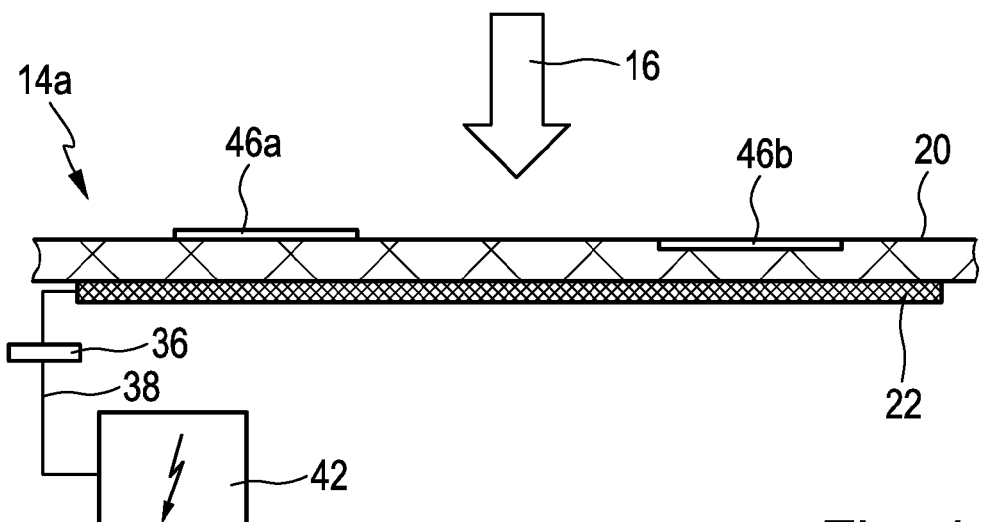
FIG. 4 shows a very simplified schematic lateral section through a further configuration of a front plate component.

Exemplary configurations in respect of the layer structure of the control panel components 14 are illustrated in FIGS. 3 and 4, which each show very simplified schematic sections through control panel components 14. FIG. 3 shows a control panel component 14, which may substantially correspond to the control panel component 14 illustrated in FIG. 2, for example. The control panel component 14 shown in FIG. 3 comprises a cover layer 20, a sensor layer 22 and an indicator layer 24. The indicator layer 24 is provided with various discrete indicator elements 30a, 30b, 30c. The control panel component 14 may be coupled to a control device 42, which may communicate with the sensor layer 22 and the indicator layer 24 via an interface 36 and corresponding connecting lines 38, 40. The control device 42 is connected to the sensor layer 22 via the connecting line 38. The control device 42 may detect information items which describe, for example, touches or increasing proximity to an outer face 34 of the cover layer 20 via the connecting line 38. Operator inputs may be performed by means of an actuator 32, 32a. The actuator 32, 23a may be, in particular, a body part of the operator, for example a finger. However, it is also conceivable for a stylus or the like to be used. The sensor layer 22 and the control device 42 may be configured to detect touches of the cover layer 20, cf. the finger 32. Alternatively or in addition, the sensor layer 22 and the control device 42 may also be configured to detect increasing proximity, i.e. no direct touching contact, to the cover layer 20, cf. the finger 32a.

In addition, the control device 42 may be coupled to the discrete indicator elements 30a, 30b, 30c via the connecting line 40. The discrete indicator elements 30a, 30b, 30c may be actuated or activated selectively in order to instruct the operator or guide the operator during a desired operator input. In particular, the discrete indicator elements 30a, 30b, 30c may be used for visually highlighting a presently allocated and provided subsection or field of the sensor layer 22. In this way, the sensor layer 22 may be used for a large number of different inputs and is configurable flexibly in this regard.

It goes without saying that the discrete indicator elements 30a, 30b, 30c in various alternative configurations may also at least partially overlap one another. In this way, one and the same region of the cover layer 20 may be used for different inputs, depending on the configuration of the sensor layer 22. By way of example, one and the same region may, in the case of a washing machine, be used for selecting a program mode, for preselecting temperature and for time control and for the required user inputs or operator inputs associated therewith. It goes without saying that the section actually used in each case or the respectively selected field of the sensor layer 22 does not need to be identical or congruent. Instead, by means of logic actuation of the sensor layer 22, a large number of sections or fields may be defined and may be used for detecting and evaluating operator inputs. The definition and allocation of the fields may take place, for example, on a software basis and/or using circuitry.

FIG. 4 shows an alternative configuration of a control panel component 14a. The control panel component 14a comprises a cover layer 20 and a sensor layer 22, which is arranged or applied on that side of the cover layer 20 which is remote from the operator. The sensor layer 22 is configured for detecting touches or increasing proximity. For actuation or evaluation of inputs detected at the sensor layer 22, the control panel component 14a may be coupled to a control device 42, which may be connected to the sensor layer 22 via an interface 36 by means of a connecting line 38. The cover layer 20 may furthermore be provided with at least one operating symbol 46. By way of example, the control panel component 14 illustrated using FIG. 4 comprises a raised operating symbol 46a and a depressed operating symbol 46b on its cover layer 20. In general, the operating symbols 46 may be provided so as to be optically and/or haptically perceivable in the cover layer 20.

Printing methods, surface treatment and/or surface coating methods, material removal methods or the like are suitable, for example, for producing the operating symbols 46. The operating symbols 46 may be introduced into the cover layer 20 during shaping thereof, for example during injection molding. The operating symbols 46 may in principle comprise color highlighting. As has previously been illustrated, the sensor layer 22 may define a potentially possible region in which user inputs may be detected. The sensor layer 22 may now be actuated in such a way that certain sections or fields, i.e. subsets of the sensor layer 22, may be used and evaluated in a targeted manner for specific user inputs. The respectively defined fields may be in particular adjacent or assigned to the respective operating symbol 46a, 46b.

In accordance with a further exemplary embodiment, for example, a "semi-finished product" of the control panel component 14a may be manufactured which comprises a basic configuration. Such a "semi-finished product" may then be used for forming variants by virtue of various operating symbols 46 being highlighted in a targeted manner thereon. This may be performed, for example, by means of printing. A presently selected configuration of the operating symbols 46a, 46b may be linked with an associated logic actuation of the sensor layer 22. On the basis of only a basic configuration, a large number of variants may be realized; this may be performed without any substantial additional complexity in terms of the hardware for the detection and evaluation of the operator inputs.

Figure 5:
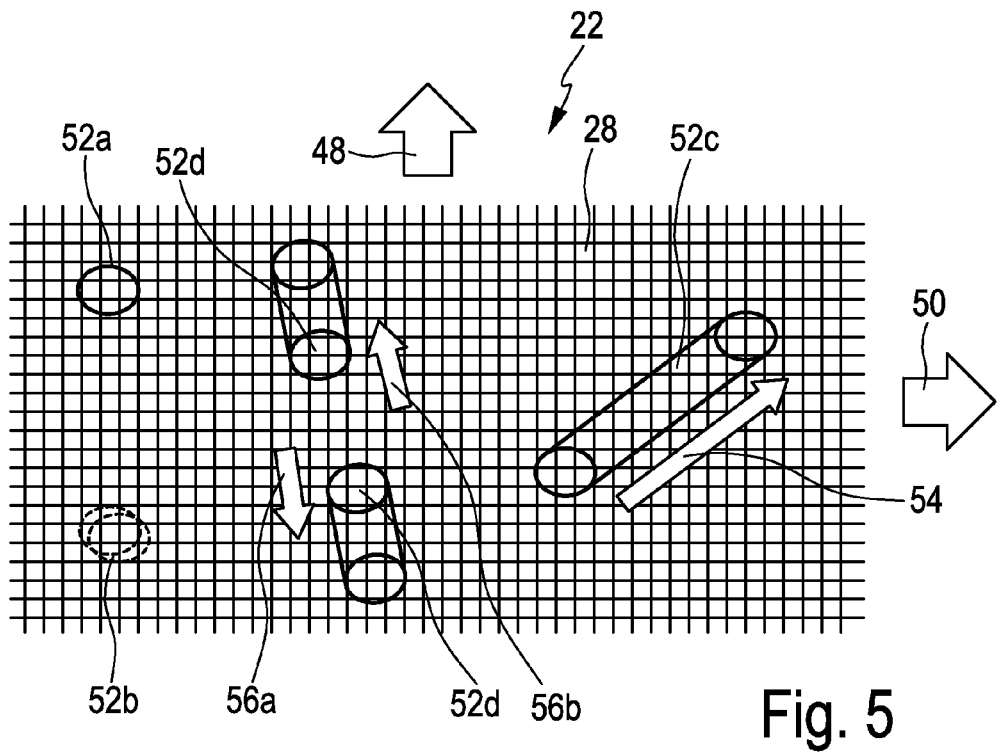
FIG. 5 shows a schematically very simplified plan view of a sensor layer for visualizing possible user inputs or user gestures.

FIG. 5 illustrates a schematic plan view of an exemplary sensor layer 22. The sensor layer 22 comprises a sensor network 28, which may have, for example, a structure comprising columns and rows. In this case, for example, an arrow denoted by 48 may illustrate a first direction and an arrow denoted by 50 may illustrate a second direction. The arrows 48, 50 may represent, by way of example, an X direction and a Y direction. The sensor layer 22 is designed to detect operator inputs in terms of location (i.e. in relation to the first direction 48 and the second direction 50). This may take place, for example, in the case of a capacitive sensor layer 22, by influencing of a capacitance on the basis of a touching contact or an increasing proximity which is detected and evaluated.

By way of example, FIG. 5 also illustrates various conceivable operator inputs or operator gestures which may be detected and evaluated. 52a illustrates a single touch (tap or click). 52b illustrates a double touch in temporal succession (a so-called double click). 52c illustrates a gesture in the form of a sliding movement (so-called swiping), cf. also the associated movement direction which is illustrated by an arrow denoted by 54. In addition, 52d illustrates a complex gesture which may be performed, for example, using two fingers (or finger and thumb). This may include, for example, a substantially simultaneous touch with two fingers and, after this, a movement of the fingers away from one another, cf. the associated directional indications which are illustrated by the arrows denoted by 56a, 56b. Such a gesture may be used, for example, for scaling or "zooming".

In an exemplary embodiment the sensor layer 22 is designed for simultaneous detection of a plurality of touches or increasing proximity. Such a function may be referred to as multi-touch functionality.

Figure 6:
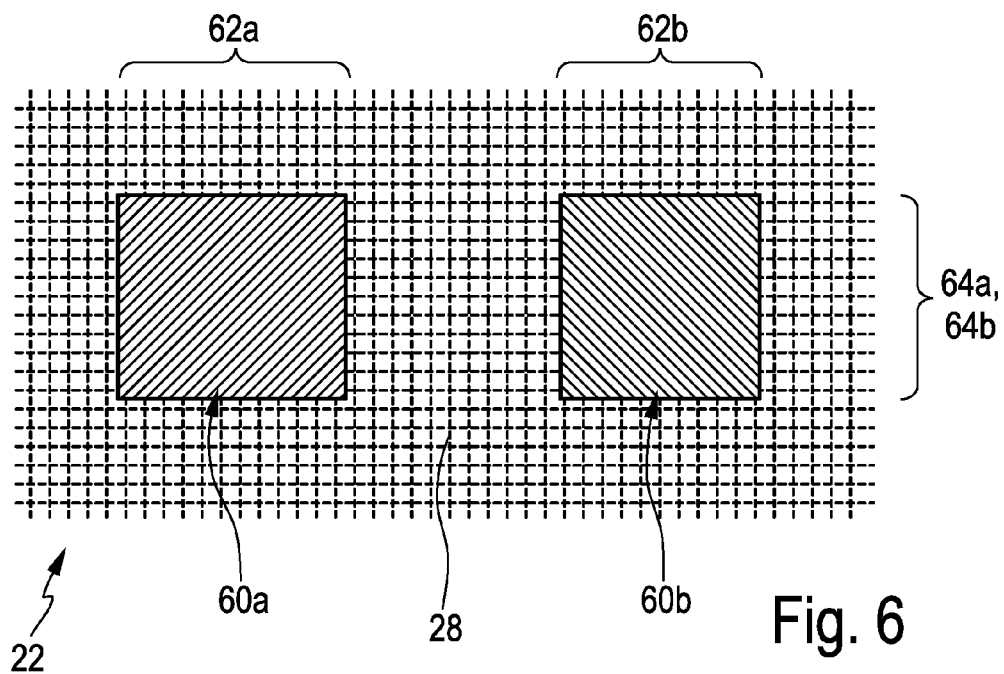
FIG. 6 shows a further schematically very simplified plan view of a sensor layer with allocated fields in which user inputs are to be detected.

FIG. 6 illustrates a logical subdivision of a sensor layer 22. As already illustrated above, the sensor layer 22 may define a region which may potentially be used for detecting user inputs. Within this potentially possible region, for example, fields 60a, 60b may now be defined which may represent the subsets of the sensor layer 22. The allocation and definition of the fields 60a, 60b may take place flexibly and may be associated with little complexity (in terms of software or circuitry). One and the same region of the sensor layer 22 may be used (temporally spaced apart) for different fields 60, which may at least partially overlap one another. For detection in terms of position of operator inputs which are performed in field 60a, in particular regions denoted by 62a, 64a of the sensor layer 22 need to be evaluated. In order to detect operator inputs which are performed in the field 60b, in particular monitoring of a region of the sensor layer 22 which is denoted by 62b, 64b is of interest. The regions 60a, 60b are flexibly selectable and may be stored in the control device 42 (cf. FIG. 3 and FIG. 4), for example, using software or circuitry during manufacture.

Various further exemplary configurations of control panel components which comprise various discrete indicator elements and/or operating symbols for operator guidance are illustrated using FIGS. 7, 8, 9 and 10.

Figure 7:
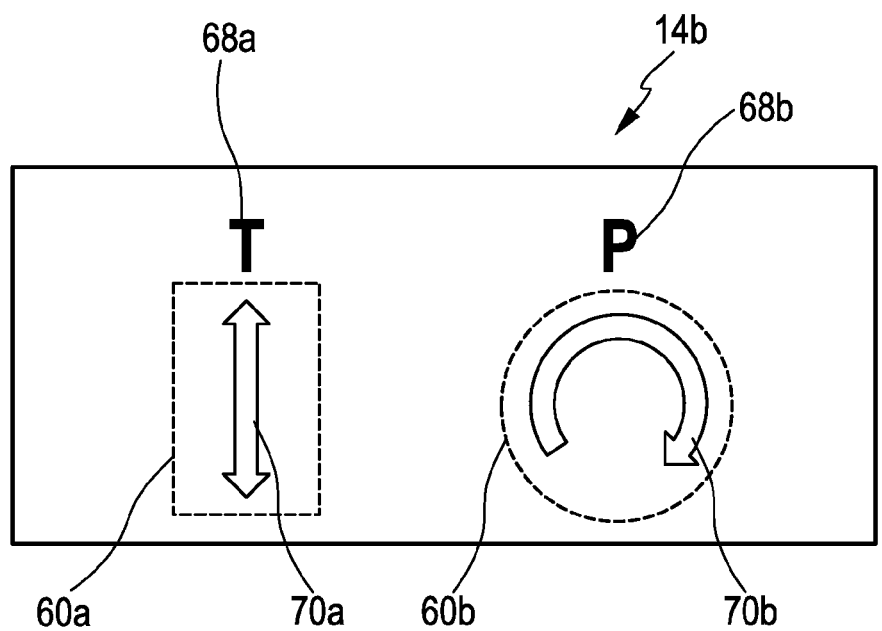
FIG. 7 shows a schematically very simplified front view of a configuration of a front plate component with visual elements for operator guidance.

The control panel component 14b shown in FIG. 7 comprises information objects 68a, 68b which, in principle, may be formed by one of the indicator elements 30 of the indicator layer 24 or by one of the operating symbols 46 of the cover layer 20. In addition, the control panel component 14b comprises discrete indicator elements in the form of pictograms 70a, 70b. The pictograms 70a, 70b may be, by way of example, light indicators or illuminated symbols. In the present configuration, fields 60a, 60b of the sensor layer 22 (cf. FIG. 6) may be defined or selected in such a way that a first field 60a extends in a region in which the pictogram 70a is arranged. In addition, a field 60b may extend in a region in which the pictogram 70b is arranged. The operator may now perform his inputs directly via the pictograms 70a, 70b, which may furthermore indicate to him also the desired nature of the input.

By way of example, the operator may perform a swiping movement or sliding movement in the field 60a, which swiping movement or sliding movement is oriented on the pictogram 70a which represents a double arrow. In this way, the operator may select a temperature, for example. The pictogram 70b illustrates a circular arrow. In this way, it is possible to indicate to the operator that he may select a program, for example, by means of a swiping movement along a circular path. The exemplary embodiment illustrated using FIG. 7 may be coupled to a further indicator (not illustrated) in order to provide feedback to the operator in respect of his input.

Figure 8:
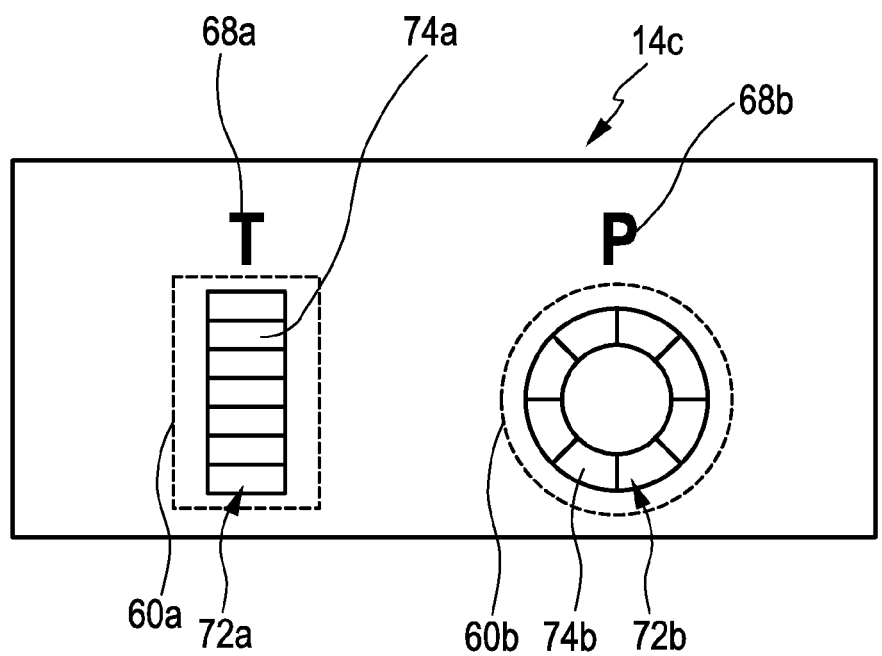
FIG. 8 shows a further simplified front view of an alternative configuration of a front plate component with visual elements for operator guidance.

FIG. 8 illustrates a further exemplary configuration of a control panel component 14c. The control panel component 14c is provided, by way of example, with information objects 68a, 68b, which may be configured, for example, as printed or similarly configured operating symbols. In addition, the control panel component 14c comprises indicator elements in the form of segment indicators 72a, 72b, which are (logically) linked to defined fields 60a, 60b of the sensor layer 22 (cf. FIG. 6). Each of the segment indicators 72a, 72b may be formed from a plurality of selectively activatable segments 74a, 74b. The segment indicators 72a, 72b and the fields 60a, 60b associated therewith may be linked to one another in such a way that a user may perform an input directly on the respective indicator. In other words, the operator may activate, for example, one of the segments 74a, 74b by means of a corresponding touch or similar gesture. Feedback to the operator may be performed without any signifimayt time delay by activation or deactivation of the corresponding segment 74a, 74b.

The segment indicator 72a may act as bar indicator, for example. The bar indicator may illustrate a temperature level, for example. The operator may select a desired temperature level by touching or "swiping", and this temperature level is fed back to said operator directly by corresponding activation of the segment 74a of the segment indicator 72a. Similarly, the operator may select a desired program, for example, in the case of the segment indicator 72b by selecting one of the segments 74b. This may be illustrated to him directly after his selection by visual highlighting of the selected or deselected segment 74b.

Figure 9:
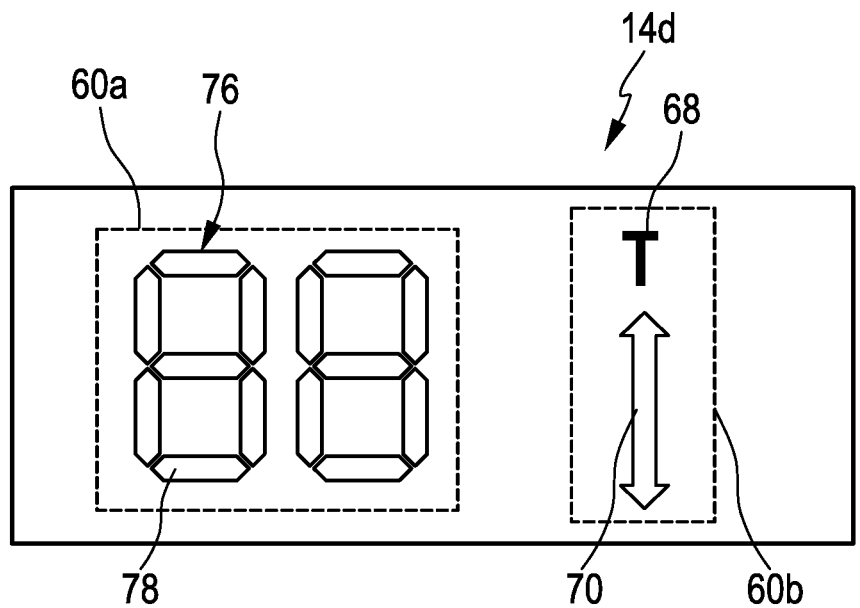
FIG. 9 shows yet a further simplified front view of a further alternative configuration of a front plate component with visual elements for operator guidance.

FIG. 9 shows a further alternative configuration of a control panel component 14d. The control panel component 14d may also comprise operating symbols which are visually and/or haptically perceivable on the associated cover layer (cf. FIG. 4). These may be printed text 68, for example. The printed text 68 may indicate, by way of example, a linked field 60b which is located in the region of a pictogram which is configured as an illuminated symbol 72, by way of example. The printed text 68 and the illuminated symbol 70 may jointly instruct the user during his input. It goes without saying that a selected (operating) field 60 may in principle also be linked to a passive operating symbol, for example passive printed text or the like, without an (active) indicator element being assigned to the (operating) field 60. Corresponding printed text may include, for example, a symbol and an identification of the region in which the user may make his inputs or may perform his selection.

In addition, the control panel component 14d comprises a segment indicator 76, which is configured in particular as a seven-segment indicator. The segment indicator 76 comprises a plurality of segments 78. A corresponding field 60a for operator inputs is associated with the seven-segment indicator 76. It is conceivable for the operator to be able to perform inputs directly at the indicator 76 in the field 60a, for example by selectively activating or deactivating one of the segments 78. In addition, it is conceivable for the segment indicator 76 to be used for feedback to the operator when said operator is performing inputs over the pictogram 70 in the field 60b, for example.

Figure 10:
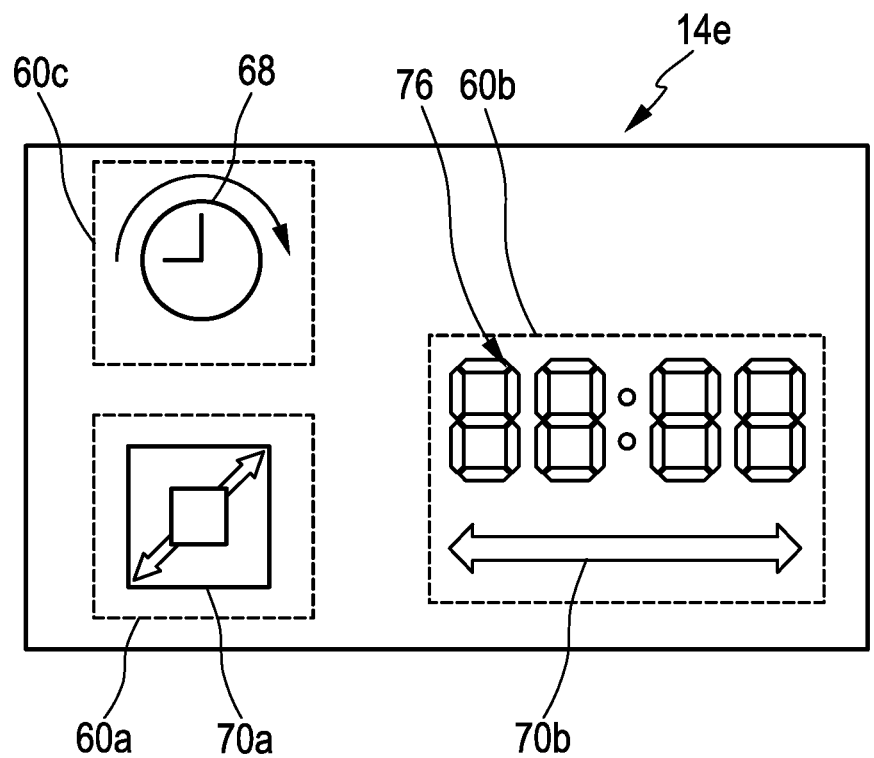
FIG. 10 shows a further simplified front view of yet another configuration of a front plate component with visual elements for operator guidance.

FIG. 10 illustrates a further configuration of a control panel component 14e, which may comprise various indicator elements and operating symbols for operator guidance. For example, an operating symbol in the form of printed text 68, representing a clock, is provided. In this way, it is communicated to the operator that a time period or clock time may be set at the control panel component 14e. This may take place, for example, in a field 60b which is defined in the sensor layer 22. The field 60b may be assigned to a seven-segment indicator 76, by way of example. In addition, the field 60b may cover a pictogram or an illuminated symbol 70b, at which the operator may perform his inputs. Feedback may be performed directly via the seven-segment indicator 76.

The control panel component 14e also comprises a field 60a, which is arranged above a pictogram 70a. The pictogram 70a may indicate to the operator, for example, that he may perform inputs in the field 60a in order to perform scaling or matching of the input sensitivity in the field 60b.

In other words, the operator may reduce or increase the sensitivity to time inputs in the field 60*a* by means of a "zoom gesture", for example. In this way, firstly it is possible to run through the potential value range quickly. Secondly, it is possible to perform a high-accuracy input where it is desired. It would in principle also be conceivable to arrange an input field 60*c* directly above the symbol which is illustrated by the printed text and/or surface processing 68. In this way, a user may effect a corresponding input, for example by gestures which he performs directly on the symbol (in this case on the representation of a clock, for example).

It goes without saying that the active objects 70, 72 and 76 which are illustrated using FIGS. 7 to 10 may be arranged as indicator elements in the indicator layer 24. These elements may be activated selectively and in this way perceived visually by the operator through the sensor layer 22 and the cover layer 20.

Furthermore, it goes without saying that the aspects and configurations illustrated using the exemplary configurations shown in FIGS. 7 to 10 may be combined with one another as desired in order to be able to provide a large number of different input possibilities to the operator in a simple manner with little production complexity. This takes place in principle with a high degree of versatility in terms of variants. A significant advantage consists in the free scalability and assignability of the selected (operating) fields 60 in the region which is made available by the sensor layer 22, in principle.

Figure 11:
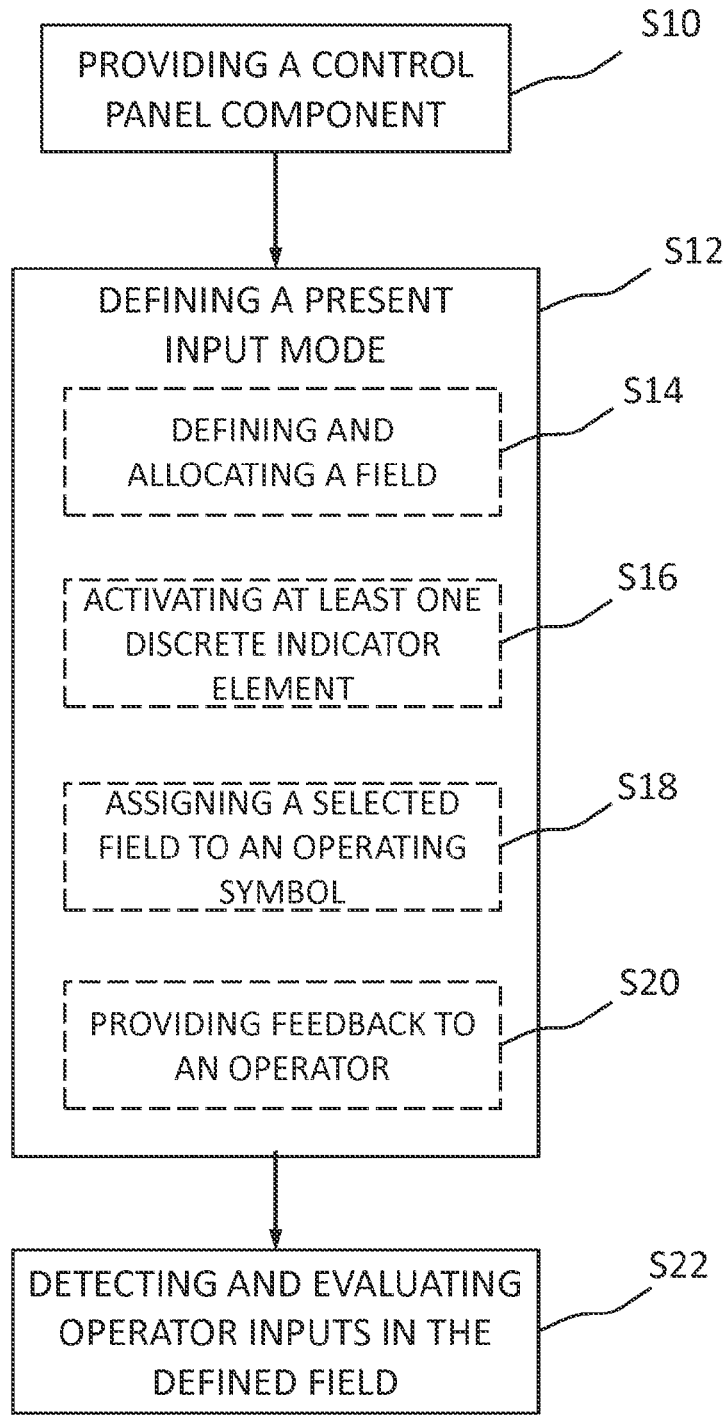
FIG. 11 shows a schematic block diagram of an exemplary embodiment of a method for operator guidance for operator inputs, in particular in a home appliance.

FIG. 11 illustrates, in simplified form, an exemplary embodiment of a method for operator guidance, for example for operator inputs in the case of a home appliance. This may take place advantageously using a control panel component 14 and an operating front plate 12 provided therewith, which are configured in accordance with various aspects of the aspects mentioned and described above. In a step S10, a control panel component is provided which comprises a sensor layer hidden by a cover layer, which sensor layer is designed to detect operator inputs and in particular operator gestures.

In a further subsequent step, a present input mode is defined. The step S12 may in particular include a (sub)step S14, in which a field which comprises a section or a subset of the sensor layer, for example, is defined and allocated for evaluation. In addition, this may be linked with a (sub)step S16, which comprises the activation of at least one discrete indicator element in order to visually illustrate the presently activated field to the user for his inputs. Alternatively or in addition, in step S12, a (sub)step S18 may be provided which comprises the assignment of a selected (operating) field to an operating symbol, which is provided on the cover layer of the control panel component. The operating symbol may be, for example, a printed operating symbol or the like. A field which is in principle freely selectable in the region of the sensor layer may be assigned to the operating symbol (on a software or circuitry basis).

In addition, the step S12 may comprise an optional (sub)step S20, which comprises outputting feedback to the operator. For this purpose, at least one discrete indicator element may be actuated or activated. In this way, an input made by the operator may be made directly visually identifiable to the operator. In an exemplary embodiment the at least one indicator element is arranged in the region of the presently allocated field for operator inputs. Thus, the operator is given the impression of performing his inputs "directly" at the indicator element. Step S12 may be followed by a step S22, which comprises the detection and evaluation of the operator inputs in the presently defined field to be evaluated.

Figure 12:
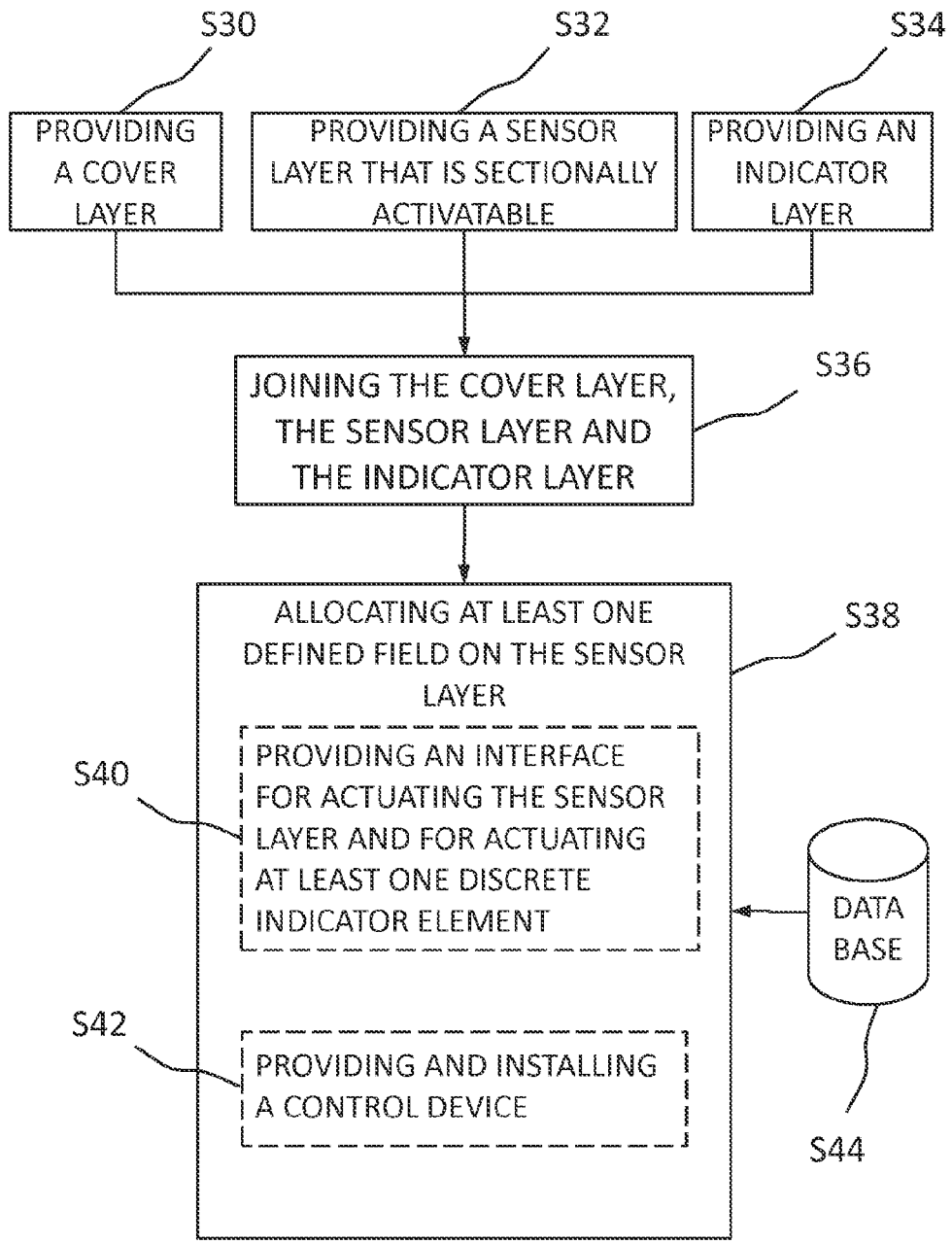
FIG. 12 shows a schematic block diagram of an exemplary embodiment of a method for producing a front plate component, in particular for an operating front plate of a home appliance.

FIG. 12 illustrates, in simplified form, an exemplary embodiment of a method for producing or manufacturing a control panel component, in particular for an operating front plate of a home appliance. The method may comprise steps S30, S32 and S34. The step S30 comprises the provision of a cover layer, in particular a cover layer consisting of a plastic material. The step S32 comprises the provision of a sectionally activatable sensor layer, in particular an areally extending sensor layer which is designed to detect operator inputs, in particular operator gestures. The step S34 comprises the provision of an indicator layer, which comprises at least one discrete indicator element, which is selectively activatable.

Steps S30, S32 and S34 may be followed by a step S36, which comprises joining the cover layer, the sensor layer and the indicator layer. In this case, the sensor layer may be arranged on a side of the cover layer which is remote from the operator (during normal operation). The indicator layer with the at least one discrete indicator element may be arranged on that side of the sensor layer which is remote from the operator.

This may be followed by a step S38, which comprises allocation of at least one defined field on the sensor layer depending on a desired input mode. For example, fields on the sensor layer 22 may be selected and defined which are assigned to at least one discrete indicator element. In addition, however, fields which are assigned to operating symbols or similar optically and/or haptically perceivable symbols which are provided in the cover layer may also be selected. The step S38 may be performed particularly flexibly in order to implement a large number of variants on the basis of a given sensor layer.

The step S38 may comprise a step S40, which comprises the provision of an interface for actuation of the sensor layer and, if required, for actuation of the at least one discrete indicator element. In addition, the step S38 may comprise the provision and installation of a control device as is illustrated by a step S42. A control device may be linked, via the interface, to the composite structure comprising the cover layer, the sensor layer and, if provided, the indicator layer. In step S38, access may be made to a database, cf. the reference symbol S44. A plurality of potentially possible configurations including respective input modes may be stored in the database. In step S38, flexible allocation and configuration of a system which comprises the control panel component and the control device linked therewith via the interface or the associated control device may be performed using the database. A configuration of the control device may be performed on a software and/or hardware basis.

Overall, the sensor layer which is provided in a flat manner at the cover layer enables a free and flexible configuration for a large number of different operator inputs. The sensor layer, if provided, may be used for user guidance and for interaction with the user/operator. It is also possible for discrete indicator elements with a comparatively simple configuration or operating symbols provided on the cover layer to provide the operator with the possibility of performing complex operator inputs. This may take place in particular without complex pixel-based indicator elements, with the result that the manufacture may involve a reduced amount of complexity.

What is claimed is:

1. A method for selective operator guidance for operator inputs in a home appliance, comprising the following steps:

providing a control panel component comprising a sensor layer covered by a cover layer, wherein the sensor layer is a film component that is configured to detect different operator inputs based on a desired input mode, and that comprises a two-directional location detecting sensor network, wherein the sensor layer is flexibly configurable during operation of the home appliance corresponding to the desired input mode from an available plurality of input modes, and wherein the sensor network forms a changeable area which is available for the operator inputs, the changeable area capable of changing based on the desired input mode and the corresponding operator input, providing an indicator layer comprising a plurality of selectively activatable permanently fixed portions of physical discrete indicator elements within the indicator layer, with one of the plurality of the discrete indicator elements activatable based on the desired input mode, wherein selective activation includes illuminating the one of the plurality of discrete indicator elements, defining a present input mode, comprising:
allocating at least one defined field corresponding to the changeable area to be monitored for operator inputs on the sensor layer depending on the desired input mode and the corresponding selectively activated discrete indicator element, wherein the at least one defined field is a subset of available area formed by the sensor network, and
activating the one of the plurality of discrete indicator element for selective operator input, and
detecting and evaluating operator input in the at least one defined field.

2. The method as claimed in claim 1, wherein the step of providing the indictor layer further comprises:
arranging the at least one discrete indicator element of the indicator layer on a side of the sensor layer facing away from the cover layer for identifying the at least one defined field to be evaluated of the sensor layer.

3. The method as claimed in claim 1, wherein the step of defining the present input mode further comprises the following:
assigning the at least one defined field to be evaluated for operator inputs to an operating symbol which is optically or haptically perceivable at the cover layer.

4. The method as claimed in claim 1, further comprising:
outputting feedback to the operator by selective activation of the at least one discrete indicator element of the indicator layer.

5. A control panel component, comprising:
a cover layer,
a flexibly configurable sensor layer, and
an indicator layer comprising a plurality of selectively activatable permanently fixed portions of physical discrete indicator elements within the indicator layer, wherein selective activation includes illuminating one of the plurality of discrete indicator elements,
wherein the sensor layer at least sectionally covers a rear side of the cover layer,
wherein the sensor layer is arranged between the cover layer and the plurality of portions of discrete indicator elements, with the one of the plurality of discrete indicator elements activatable based on the desired input mode and the corresponding selectively activated discrete indicator element,
wherein the sensor layer is a film component that is configured to detect different operator inputs based on a desired input mode from an available plurality of input modes,
and that comprises a two-directional location detecting sensor network,
wherein the sensor network forms an area which is available for the operator inputs,
wherein the sensor layer is sectionally activatable depending on a desired input mode so as to define at least one field corresponding to a sectionally activatable area to be monitored for operator inputs on the sensor layer depending on the desired input mode, wherein the at least one defined field is a subset of the available area formed by the sensor network, and
wherein the one of the plurality of discrete indicator elements is activatable for selective operator input.

6. The control panel component as claimed in claim 5, wherein the sensor layer is configured to detect operator gestures, involving swiping gestures.

7. The control panel component as claimed in claim 5, wherein the sensor layer is arranged as a capacitive sensor layer.

8. The control panel component as claimed in claim 7, wherein the sensor layer is arranged to detect touches on the cover layer or approximations to the cover layer in the region of the sensor layer.

9. The control panel component as claimed in claim 5, further comprising an interface for a control device, wherein the control device is configured, when being coupled to the interface, to selectively actuate the sensor layer and the one discrete indicator element, thereby defining a plurality of input modes.

10. The control panel component as claimed in claim 9, wherein the control device is configured to define a present input mode, and wherein the control device is further configured to allocate at least one field to be evaluated for operator inputs on the sensor layer under consideration of at least one selected input mode.

11. The control panel component as claimed in claim 5, further comprising at least one indicator element arranged as a discrete selectively activatable symbol or a discrete selectively activatable segment indicator.

12. The control panel component as claimed in claim 11, wherein the at least one indicator element is arranged as a seven-segment indicator.

13. The control panel component as claimed in claim 5, wherein the cover layer and the sensor layer are at least sectionally transparent or translucent.

14. The control panel component as claimed in claim 5, wherein the cover layer is at least sectionally surface-treated, and wherein the cover layer comprises at least one optically or haptically perceivable operating symbol for operator guidance.

15. A home appliance comprising a control panel component as claimed in claim 5.

16. A method for producing a flexibly configurable control panel component for a home appliance, comprising the following steps:
providing a cover layer,
providing a flexibly configurable sensor layer which is sectionally activatable and configured to detect operator inputs based on a desired input mode of an available plurality of input modes, wherein the sensor layer is a film component that is configured to detect operator inputs and that comprises a two-directional location detecting sensor network, and wherein the sensor network forms an area which is available for the operator inputs, a sectionally activatable area capable of changing based on the desired input mode and the corresponding operator input, providing a plurality of selectively activatable permanently fixed portions of physical discrete indicator elements within the indicator layer, with one of the plurality of discrete indicator elements activatable based on the desired input mode, wherein selective activation includes illuminating the one of the plurality of discrete indicator elements, joining the cover layer, the sensor layer and the one discrete indicator element, and allocating at least one field corresponding to the sectionally activatable area to be monitored for operator inputs on the sensor layer depending on a desired input configuration of the control panel component and the corresponding selectively activated discrete indicator element, wherein the at least one field is a subset of available area formed by the sensor network, wherein the one of the plurality of discrete indicator elements is activatable for selective operator input.

17. The method as claimed in claim 16, wherein the step of providing a sectionally activatable sensor layer further comprises:

providing a sensor layer extending in a flat areal manner which is configured to detect operator gestures.

18. The method as claimed in claim 16, further comprising the following steps:

joining the cover layer, the sensor layer and the one discrete indicator element, in such a way that, the sensor layer is arranged between the cover layer and the one discrete indicator element, and providing an interface for a control device for actuating the one discrete indicator element and for evaluating operator inputs detected at the sensor layer for selective operator guidance.

19. The method as claimed in claim 16, further comprising the following steps:

processing the cover layer, and allocating at least one field to be evaluated for operator inputs on the sensor layer depending on a size or arrangement of at least one optically or haptically perceivable operating symbol at the cover layer for operator guidance.

20. The method as claimed in claim 19, wherein the step of processing the cover layer comprises:

printing or coating the cover layer, thereby generating at least one optically or haptically perceivable operating symbol for operator guidance.

* * * * *